United States Patent [19]
Wilson

[11] Patent Number: 5,298,073
[45] Date of Patent: Mar. 29, 1994

[54] TWO SENSOR FOR DETERMINING SPACING BETWEEN SURFACES

[75] Inventor: R. Scott Wilson, Maumee, Ohio

[73] Assignee: Libbey-Owens-Ford Co., Toledo, Ohio

[21] Appl. No.: 843,828

[22] Filed: Feb. 28, 1992

[51] Int. Cl.⁵ .................. B05C 11/00; G01B 13/12
[52] U.S. Cl. ..................... 118/712; 33/501.02;
    65/158; 65/182.3; 73/37.5; 73/37.7; 118/718
[58] Field of Search ........ 73/37.5, 37.6, 37.7,
    73/866.5; 65/29, 60.1, 158, 161, 182.3, 182.4;
    118/668, 671, 676, 680, 712, 718, 729;
    204/298.03; 427/8; 33/501.02

[56] References Cited

U.S. PATENT DOCUMENTS

| Re. 26,206 | 5/1967 | Knobel | 73/37.5 |
| 3,164,981 | 7/1965 | Knobel | 73/37.5 |
| 3,174,328 | 3/1965 | Hollister et al. | 33/501.02 |
| 3,194,055 | 7/1965 | Knobel | 73/37.7 |
| 3,482,954 | 12/1969 | Yuen | 65/29 |
| 3,850,679 | 11/1974 | Sopko et al. | 118/718 |
| 3,888,649 | 6/1975 | Simhan | 118/718 |
| 4,440,559 | 4/1984 | Shaw | 65/182.4 |
| 4,762,578 | 8/1988 | Burgin et al. | 118/712 |
| 4,793,282 | 12/1988 | Greenberg et al. | 118/720 |
| 5,052,338 | 10/1991 | Maiorca et al. | 118/712 |
| 5,065,696 | 11/1991 | Greenberg et al. | 118/718 |
| 5,147,462 | 9/1992 | Wollam | 118/712 |
| 5,148,963 | 9/1992 | Hicks | 427/8 |

FOREIGN PATENT DOCUMENTS

626059 9/1978 U.S.S.R. .................. 65/60.1

Primary Examiner—Joseph W. Drodge
Attorney, Agent, or Firm—Marshall & Melhorn

[57] ABSTRACT

A method of and apparatus for determining the spacing between a ribbon of hot glass and a coater extending over the ribbon for forming a coating thereon by chemical vapor deposition. Position sensors are affixed to the coater at selected positions therealong. The sensors include an annular outlet through which a compatible gas is discharged against the glass surface from a position closely adjacent the surface, and a central opening for measuring the back pressure resulting from impingement of the gas against the glass surface. The back pressure is a function of the distance of the annular outlet from the glass surface, and the size of the annular passageway and rate of gas flow therethrough are such that a smooth well-defined pressure-versus-distance curve is produced for the range of distances within which the coater is intended to operate. Comparison of observed pressures with pressures at known distances indicate the sensor-to-glass, and hence the coater-to-glass, distance.

5 Claims, 4 Drawing Sheets

TWO SENSOR FOR DETERMINING SPACING BETWEEN SURFACES

BACKGROUND OF THE INVENTION

1. Field of the Invention

The present invention pertains to the coating of glass by means of chemical vapor deposition, and more specifically to sensing the position of a coater by which a coating gas is supplied, relative to the surface of a glass ribbon upon which a coating is to be formed.

2. Description of the Prior Art

In accordance with one highly successful method of coating flat glass, the surface of the glass is contacted while at an elevated temperature by a gas such as a metal vapor which reacts on contacting the hot surface to form a coating on the glass surface. In order to produce a uniform coating, the coating gas is preferably caused to flow substantially parallel to the surface of a moving ribbon of glass to be coated under laminar flow conditions. One method and apparatus for achieving such laminar flow conditions is disclosed in U.S. Pat. No. 4,469,045. As disclosed therein, the coating gas is directed onto a surface to be coated by a coater extending across the upper surface of an advancing ribbon of glass and transverse to the direction of movement of the ribbon. The temperature of the gas or vapor supply and that of the coater are preferably maintained sufficiently high to prevent condensation of the coating gas, but sufficiently low to avoid any substantial decomposition or other deleterious reactions of the coating gas before it reaches the glass surface. In order to achieve a uniform coating of high quality, it is imperative that the temperature and rate of flow of the gaseous coating material be precisely maintained within prescribed parameters.

There is disclosed in U.S. Pat. No. 4,793,282 a method of and apparatus for coating flat glass with a coating formed from a plurality of reactant gases. A coater is positioned above an advancing ribbon of glass maintained at a temperature suitable for formation of a coating. Reactant gases are directed to a plenum formed in the interior of the beam. The gases flow from the plenum through flow distributing mechanisms such as baffle stacks to insure homogenizing and uniform distribution across the width of the glass ribbon. The temperature of the plenum, and thus of the gases therein, is regulated by means of liquid cooling and electric heaters.

The downwardly facing surface of the coater must be positioned closely adjacent the top surface of the glass ribbon, typically on the order of 0.200 inch (5.1 mm) therefrom, for the maintenance of a parallel laminar flow of the coating gas as required for production of a uniform coating on the ribbon. The spacing of the coater from the ribbon surface must also remain constant across the width of the ribbon in order to produce a coating which is uniform across the ribbon. It has been proposed to employ various types of position sensors for determining the distance of the coater from the ribbon surface. However, none of the position sensors employed heretofore has proven entirely satisfactory in that they were not suitable for use over extended periods of time in the hostile environment encountered in the coating area. They also tended to have an adverse effect upon the coating, and the data obtained was unreliable. As a result, the position of the coater relative to the glass surface has generally been determined heretofore by visual observation and estimation. Such imprecise procedures are not conducive to formation of a uniform coating on the glass. Furthermore, due to the close proximity of the coater to the glass ribbon, even slight errors in positioning of the coater can result in the coater coming into contact with and severely damaging, it not entirely severing, the ribbon.

SUMMARY OF THE INVENTION

The present invention concerns a method of and apparatus for reliably and continuously determining the spacing between a moving ribbon of hot glass upon which a coating is being formed by a chemical vapor deposition process and a coater positioned above the ribbon and extending thereover. Position sensors are affixed to the coater at various locations therealong. The sensors are of the type wherein a gas is discharged against the glass surface from an outlet positioned closely adjacent the surface, and the back pressure resulting from impingement of the gas against the surface is determined. The back pressure is a function of the spacing of the outlet from the glass surface. The position sensor has an annular outlet, and the size of the outlet and the composition and rate of gas flow therethrough are such that the pressure-versus-distance response curve behaves in a smooth, well-defined manner relatively free from irregularities within the desired distance range. The observed pressure is compared with a curve representing pressure at known distances from the glass surface for accurately determining the sensor-to-glass, and hence the coater-to-glass, distance.

BRIEF DESCRIPTION OF THE DRAWINGS

In the drawings, wherein like numerals refer to like parts throughout.

DESCRIPTION OF THE PREFERRED EMBODIMENT

The invention will be described herein with reference to application of a coating to a newly formed glass ribbon by means of a chemical vapor deposition process within the bath of a float glass producing facility. However, it will be understood that the invention may have utility as well in other and different applications for determining the spacing between a member and an adjacent surface.

Figure 1:
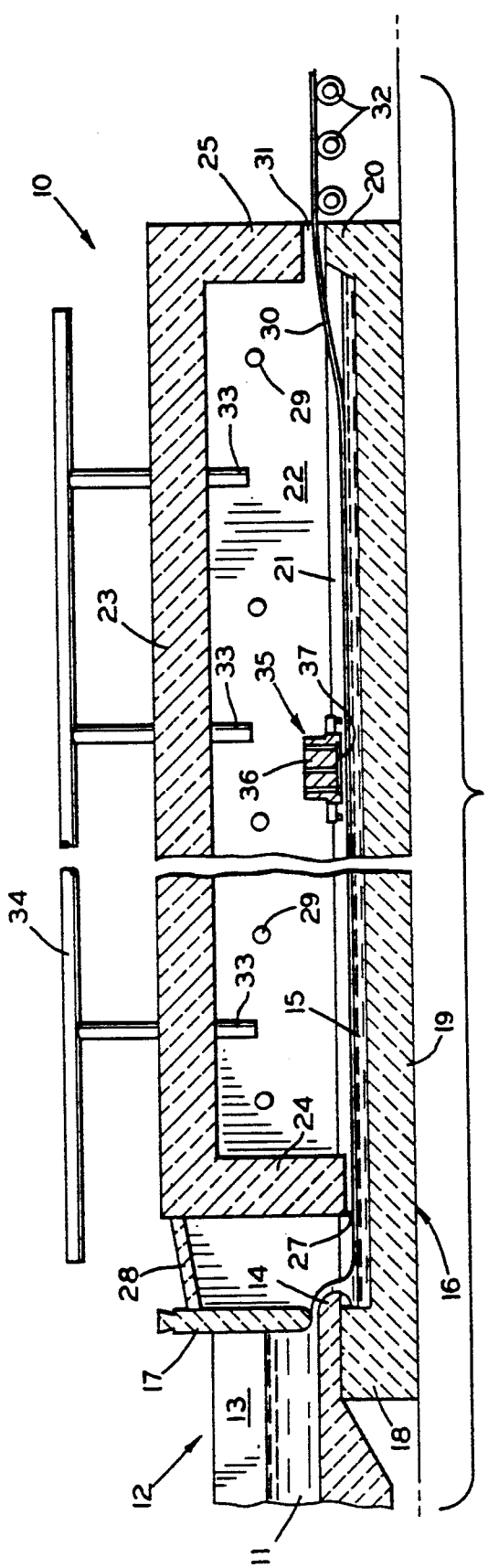
FIG. 1 is a schematic longitudinal vertical sectional view of a float glass manufacturing facility embodying a coater and position sensors in accordance with the invention.

There is illustrated generally at 10 in FIG. 1 a float glass facility of conventional design wherein molten glass 11 is delivered along a canal 12 from the outlet of a glass melting furnace (not shown). The canal terminates in a spout having opposite side jambs 13 and a lip 14 over which molten glass flows for deposit upon a bath of molten metal 15 contained within a tank structure 16. Flow of the molten glass, generally a soda-lime-silica glass, along the canal and over the spout is controlled by a vertically adjustable regulating tweel 17. The spout extends over an inlet end wall 18 of the tank structure 16 which is further comprised of a floor 19, an outlet end wall 20 and opposite side walls 21.

An enclosed head-space 22 is defined over the molten metal bath 15 by a roof structure 23, an inlet end wall 24, a downwardly depending wall 25 at the outlet end and oppositely disposed side walls 26. The inlet end wall 24 depends downwardly closely adjacent the surface of the molten metal bath 15 to define an inlet 27 of restricted height, and an extension 28 of the roof structure 23 extends to the tweel 17 to enclose the area between the tweel and the inlet end wall.

A temperature regimen is maintained along the tank structure by heaters 29 within the headspace 22, so that molten glass deposited over the spout lip 14 onto the molten metal bath 15 will spread laterally under controlled conditions and form a glass ribbon 30. The ribbon is advanced across the metal bath and gradually cooled so that it can be withdrawn through an outlet 31 between the outlet wall 25 and end wall 20, as upon driven traction rollers 32, without adversely affecting its lower surface. A plenum of protective atmosphere, generally a mixture of nitrogen and hydrogen in which nitrogen predominates, is maintained within the headspace 22 by means of ducts 33 connected to a common header 34 and extending through the roof 23. A coater, identified generally at 35 in FIG. 1, for supplying coating gas to the surface of the glass ribbon, is positioned closely adjacent the glass surface and transversely of the path of the ribbon along the bath at a position where temperature conditions are suitable for formation of the film in accordance with the selected chemical vapor deposition process. Details of the process and of a coater suitable for employment therewith are disclosed, by way of example, in the aforementioned U.S. Pat. No. 4,793,282. The particular construction of the coater is not a feature of the present invention and it will be described herein only insofar as necessary for a thorough understanding of the invention.

Figure 2:
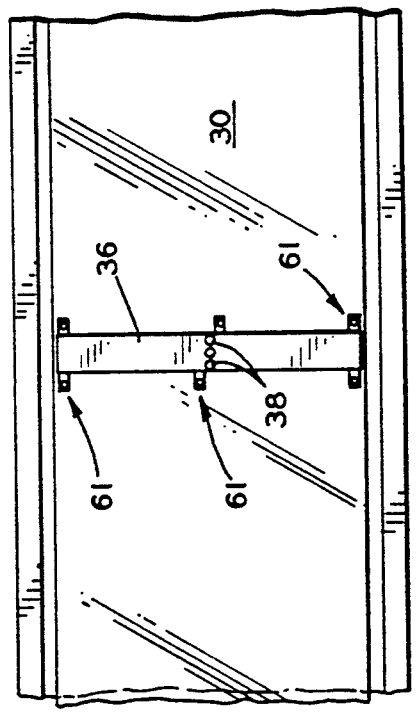
FIG. 2 is an enlarged fragmentary plan view of the coater and position sensors of the invention.

To that end, as best seen in FIGS. 1 and 2 the coater 35 comprises an elongated, generally rectangular coater assembly 36 extending across the ribbon 30, and including a lower face 37 adapted to be positioned closely adjacent the upper surface of the glass ribbon, by means of which the reactant coating materials are supplied and maintained in contact with the surface of the heated ribbon. The coater assembly may include conduit members 38 for suitably receiving coating materials and coolant in the usual manner.

Figure 3:
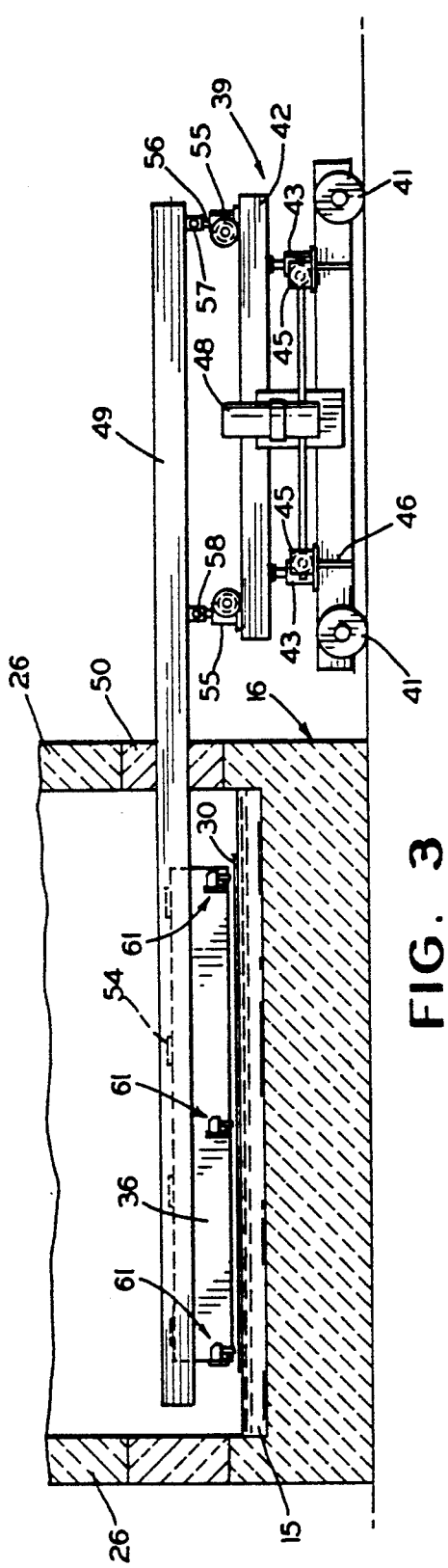
FIG. 3 is an end elevational view showing the carriage mechanism for suspending and positioning the coater within the float glass chamber.
Figure 4:
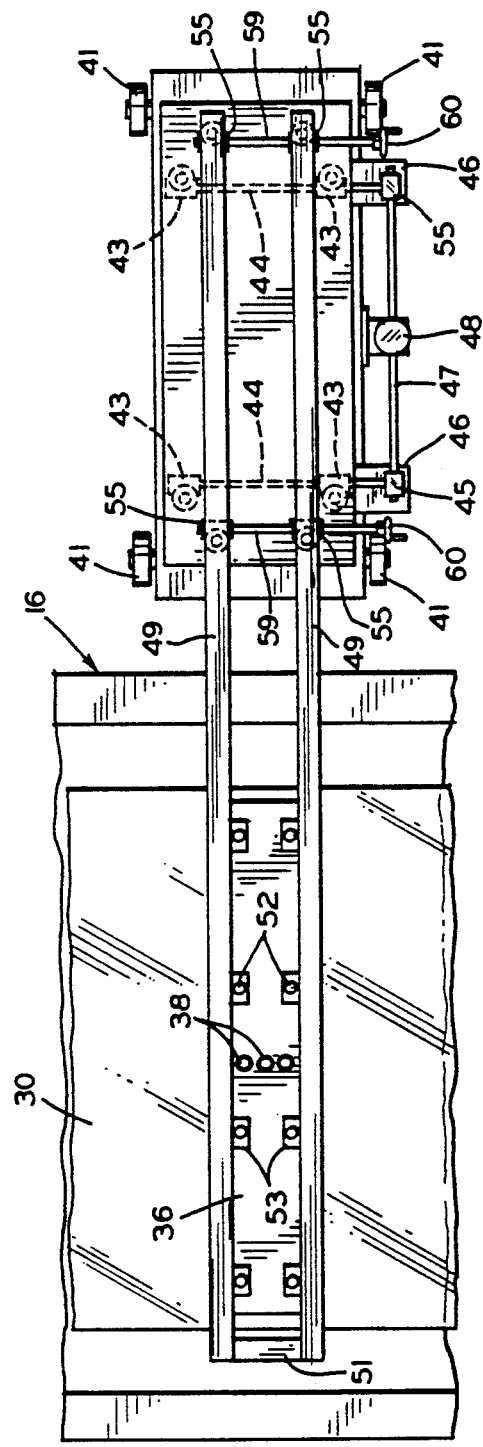
FIG. 4 is a plan view of the carriage mechanism of claim 3.

In order to produce a film of high quality, it is imperative that the lower face 37 of the coater assembly be precisely positioned relative to the upper surface of the glass ribbon 30. To that end, as best seen in FIGS. 3 and 4, the coater assembly is carried by an adjustable carriage mechanism 39 adapted to rest upon the floor alongside the tank structure 16. More particularly, the adjustable carriage mechanism includes a base 40 mounted on wheels 41 for moving the coater assembly into and out of operative position within the float glass bath and over the glass ribbon. An elevating platform 42 is carried by screw jacks 43 affixed to the base. In order to permit the platform to be raised and lowered while remaining parallel to the base 40, means is provided for operating the screw jacks in unison.

Thus, the pairs of screw jacks adjacent either end of the platform are operably interconnected by an operating shaft 44. The operating shafts are drivingly coupled through suitable right angle drive units 45 carried upon brackets 46 affixed to the base 40, to a drive shaft 47. The drive shaft is coupled to a suitably controlled motor driven gear reduction drive unit 48 carried upon a mounting plate 49 affixed to the base 40. Thus, by operation of the drive unit 48 the screw jacks 43 will be operated simultaneously so as to selectively raise or lower the platform 42 relative to the base 40 in a plane parallel to the plane of the base. Of course, manual operating means (not shown) may be provided in a conventional manner for operating the screw jacks in place of or alternatively with the drive unit 48.

The coater assembly 36 is suspended beneath a spaced pair of cantilever arms 49 carried by the platform 42 and extending through an access area 50 conventionally provided between the side walls 21 of the tank structure and the side walls 26 enclosing the headspace of such float glass facilities. For purposes of stability, the cantilever arms 49 are interconnected at their distal ends by a spacer bar 51, and means (not shown) may conventionally be provided for circulating a coolant through the arms where necessary. Likewise, means (not shown) will conventionally be provided for enclosing the access area 50 around the arms to isolate the external atmosphere.

The coater assembly 36 is preferably suspended from the cantilever arms as by carrier bolts 52 threaded through brackets 53 affixed to the arms and coupled at their lower ends by rotary connectors 54 to the coater assembly. Linear alignment of the lower face 32 of the coater assembly may thus be achieved and maintained by appropriate manipulation of the individual carrier bolts 52.

As shown in FIGS. 3 and 4, pairs of jackscrews 55 are mounted upon the elevating platform 42 at either end thereof. Extensible screw shafts 56 of the jackscrews are connected to hinge brackets 57 on the arms 49 as by hinge pins 58. The forward and rear pairs of jackscrews are each provided with a shaft 59 having a hand wheel 60 by which the shaft may be manually rotated to selectively extend or retract the shafts 55 of the associated jacks. As will be readily apparent, by appropriately manipulating the hand wheels 60 the angular altitude or position or the cantilever arms 49, and thus the coater assembly 36 suspended therefrom, may be readily adjusted to properly align the lower face 37 with the surface of the glass ribbon 30. The shaft 59 may also include conventional means (not shown) for disconnecting one of the associated jackscrews whereby one jackscrew may be operated independently of the other to raise or lower one of the arms 49 relative to the other and thereby rotate or skew the coater assembly about its longitudinal axis for properly positioning the lower face 37 relative to the surface of the ribbon.

In order to provide ongoing data for properly positioning the coater assembly 36 and in particular the lower face 37 thereof relative to the surface of the glass ribbon 30, sensing units 61 are affixed to the coater assembly at strategic locations therealong. The sensing units are of a flow/pressure-response type exhibiting a smooth and well-defined pressure-versus-distance response curve relatively free from irregularities at coater-to-glass distances in the range critical to the positioning of the coater assembly, and at flow rates and velocities not having a significant effect upon the coating. As will be seen in FIG. 2, sensing units 61 are preferably affixed to both the upstream and downstream sidewalls of the coater structure 36 adjacent each end and in the middle region thereof. Data may thus be gathered for insuring that the lower face 37 of the coater structure is positioned parallel to and at the proper distance from the top surface of the glass ribbon.

Figure 5:
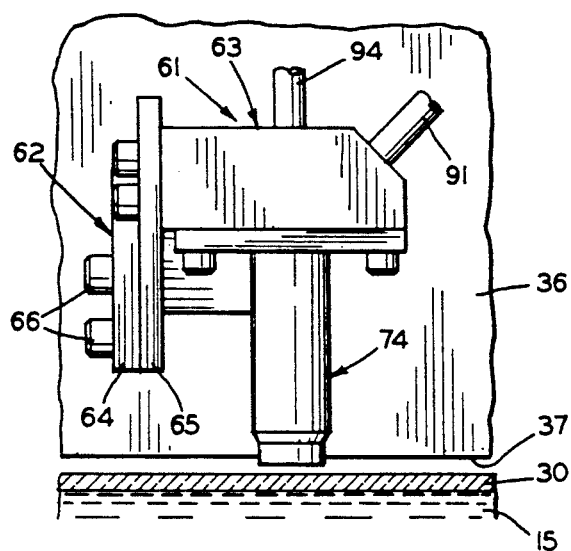
FIG. 5 is an enlarged fragmentary elevational view of the position sensor.
Figure 6:
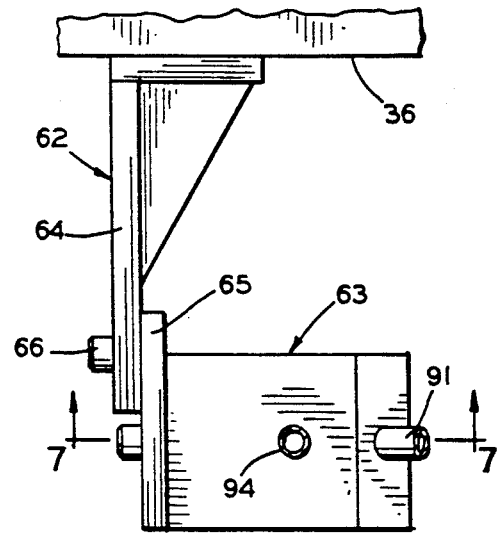
FIG. 6 is a top plan view of the position sensor of FIG. 5.
Figure 7:
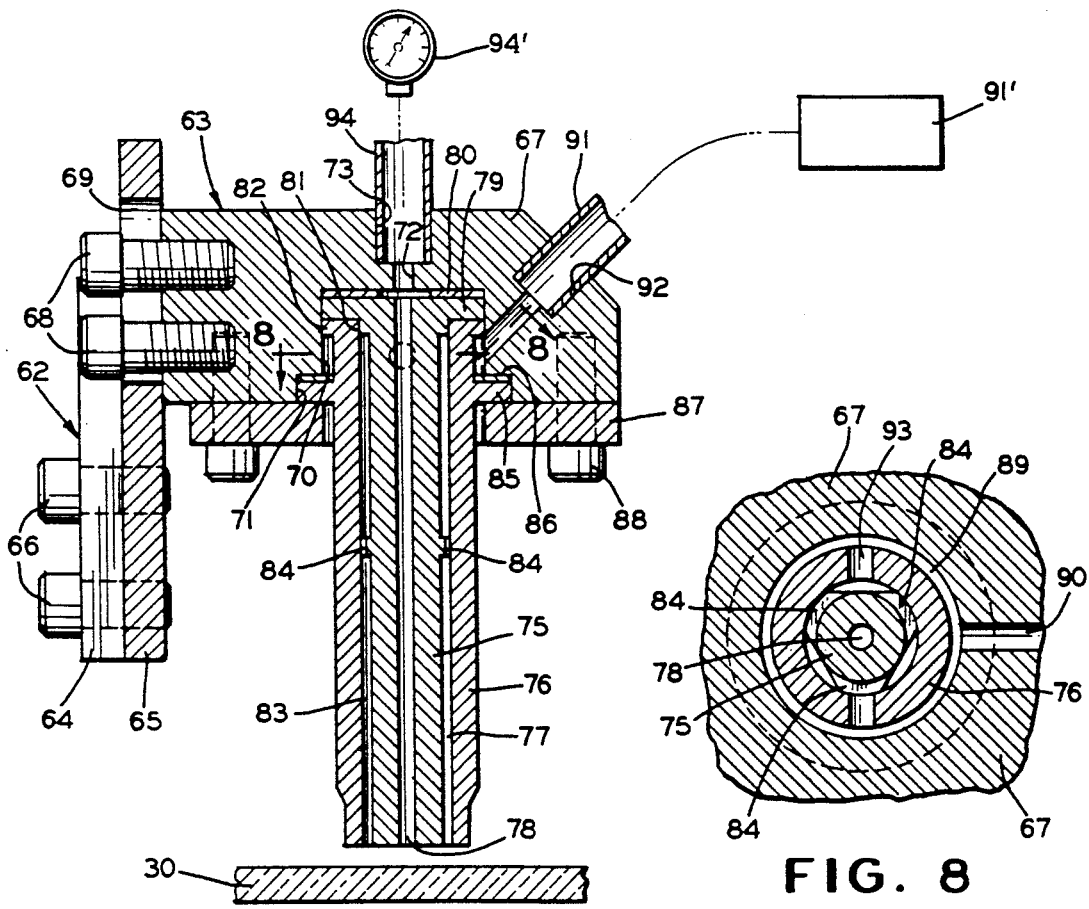
FIG. 7 is a sectional view taken substantially along line 7—7 of FIG. 6.

The sensing units 61, as best seen in FIGS. 5, 6 and 7, comprise an angle bracket 62 suitably affixed to the appropriate sidewall of the coater assembly, upon which a sensing head 63 is carried. The angle bracket more particularly includes a projecting leg 64 to which is secured a mounting plate 65 of the sensing head 63 as by stud bolts 66. A head block 67 is affixed to the mounting plate 65 by means of stud bolts 68. The bolts 68 extend through a vertically elongated slot 69 in the mounting plate and are threaded into the head block. Thus, by loosening the bolts the head block, and hence the entire sensing head 63, can be vertically adjusted long the mounting plate to correctly position the head relative to the lower face 37 of the coater assembly 36.

The head block 67 is provided with a downwardly opening bore 70 having a counter bore 71 of somewhat larger diameter at its outer end. An aligned bore 72 extending downwardly from the upper end of the head block so as to communicate with the bore 70, likewise includes a counter bore 73 extending inwardly from the upper surface of the head block. A tip assembly, identified generally at 74, is adapted for reception within the bore 70 and counter bore 71. The tip assembly more particularly comprises a central tubular member 75 disposed axially within a cylindrical housing 76 so as to define an annular space 77 therebetween. The central tubular member includes a bore 78 extending axially therethrough and an annular flange 79 for seating within the bore 70 to align the axial bore 78 with the bore 72 in the head block. A gasket 80 is provided between the flange and the base of the bore 70.

The annular flange 79 is formed with a spacer segment 81 of reduced diameter. The cylindrical housing 76 is formed with a radial end flange 82 adapted to bear against the lower surface of the annular flange 79. The cylindrical housing is of such interior diameter as to fit over the spacer segment 81 and define an annular passage 83 between the inner surface of the cylindrical housing and the exterior surface of the tubular member. It is important that the tubular member 75 remain centered within the housing 76 so that the annular passage 83 remains uniform throughout its length. To that end, the tubular member is provided with a plurality of spaced radially extending tabs 84 for axially aligning the tubular member within the cylindrical housing. The tabs are positioned at same distance from the lower extremity of the tip assembly so as to not interfere with discharge of gas from the annular passage 83 in a smooth laminar flow.

The cylindrical housing 76 is formed with a second radial flange 85 spaced some distance from the end flange 82 and adapted to be seated within the counterbore 71 in the head block. A gasket 86 is provided between the flange and the base of the counter bore, and the central tubular member and cylindrical housing are affixed to the head block by a retainer ring 87 secured as by stud belts, 88. The retainer ring thus urges the annular flange 79 and the radial flange 85 into sealing engagement with the gaskets 80 and 86, respectively.

Figure 8:
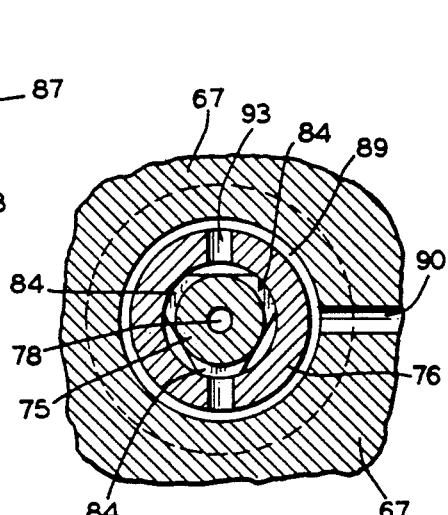
FIG. 8 is a sectional view taken substantially along line 8—8 of FIG. 7.

As seen in FIGS. 7 and 8, an enclosed annular chamber 89 surrounds the cylindrical housing 76 between the radial flanges 82 and 85. A passageway 90 in the head block provides communication between the chamber 89 and a pressurized gas supply line 91 sealingly received within a counter bore 92 in the head block. One or more openings 93 in the wall of the cylindrical housing 76 provide communication between the annular chamber 89 and the annular space 77. In the preferred embodiment illustrated in FIG. 8, two such openings are provided at diametrically opposed locations offset 90°. from the passageway 90. Thus, gas supplied from a suitably controlled source shown schematically at 91' through the supply line 91 is distributed around the annular chamber 89 to pass through the opening 93. The gas flow may for example be controlled by a commercially available rotameter. The gas then flows along the annular space 77 and is discharged in a laminar annular pattern against the glass ribbon 30.

The impingement of the gas upon the ribbon creates a back pressure between the end of the tip assembly 74 and the ribbon 30 which is a function of the distance between the ribbon surface and the end of the tip assembly. There is consequently created a back pressure within the axial bore 78 of the central tubular member. The axial bore is connected by means of a tubular member 94 sealingly received within the counterbore 73 to a suitable pressure indicating device such as a gauge 94'. The magnitude of the observed pressure for a gas having a particular density and viscosity and at a given flow rate is representative of the distance between the end of the tip assembly and glass surface, and hence the distance between the lower face 37 of the coater assembly and the glass surface.

While position sensors operable by measurement of back pressure have been known heretofore, the prior art devices were not adapted to operate in the environment or within the parameters imposed upon the present invention. Thus, in accordance with the invention the sensing units are located within the float bath enclosure, where the ambient temperature may be 1200° F. or more. Precise and reliable distance information in the range from about 0.075 inch to 0.200 inch is necessary. The atmosphere within the bath enclosure must be of such composition as to be generally inert, and slightly reducing, so as to preclude oxidation and other adverse effects upon the molten metal bath 15 and the glass ribbon. To that end, the bath atmosphere is generally predominantly nitrogen gas, with a small amount of hydrogen gas admixed as a reducing agent. The introduction of any foreign gases incompatible with the bath atmosphere or molten tin is, of course, highly undesirable. Finally, the position sensor should not adversely affect the ribbon-forming and coating processes.

In order to reliably determine the distance of the end of the tip assembly 74 from the surface of the ribbon 30 for purposes of the invention, it is important that the pressure-versus-distance response curve behave in a smooth, well-defined manner relatively free from irregularities within the distance window desirable for setting and operating the coater assembly, that is, from about 0.075 inch to 0.200 inch from the ribbon surface. For purposes of maintaining the integrity of the bath atmosphere, it is preferable that nitrogen be employed as the sensor gas and that foreign gases not be introduced to the enclosed float glass chamber. It was determined that only at very low flows (Reynolds numbers typically <700) and high, turbulent flows (Reynolds numbers typically >2100) would the position sensors exhibit smooth, regular curves with respect to sensor-to-glass distance. The high velocity, turbulent flows through the sensors may have an adverse effect upon the coating process, thus making them unsuitable for use in monitoring coater position during the CVD coating operation.

It has been found in accordance with the invention that, in general, at very low flows the pressure-versus-distance response curve becomes smooth. However, the flow rate and related Reynolds number below which this occurs is a function of the width of the annular space 77. The following examples are indicative of response curves derived in accordance with the invention:

EXAMPLE I

Figure 9:
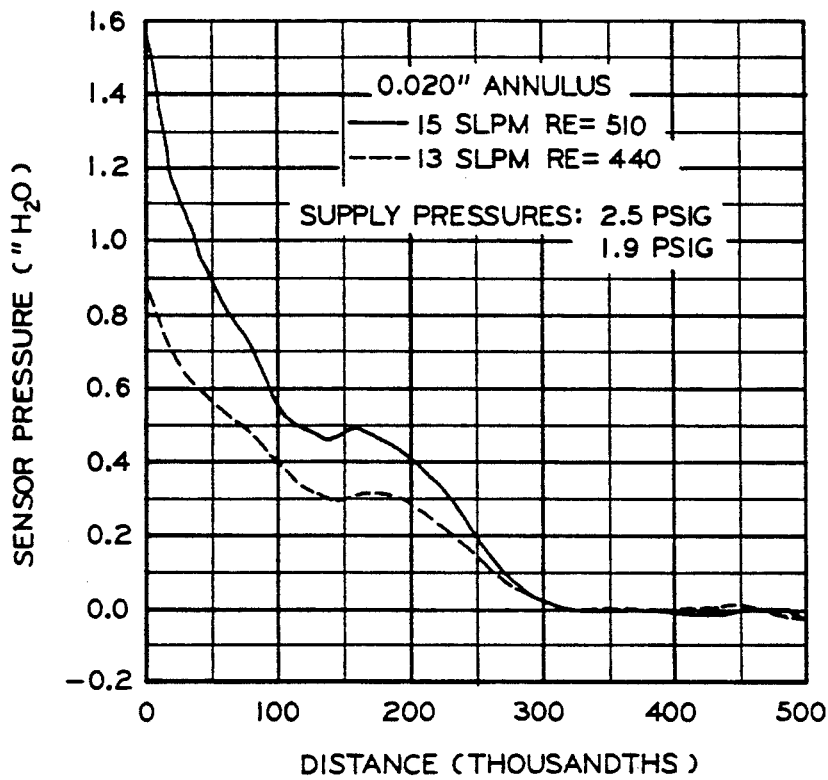
FIG. 9 is a graph illustrating pressure-versus-distance response curves for a sensing unit in accordance with the invention having an annulus width of 0.020 inch.

A tip assembly 74 was constructed wherein the end of the cylindrical housing 76 had an outside diameter of 0.400 inch and the annular space or gap 77 had a width of 0.020 inch. In other words, the distance between the inner surface of the housing 76 and the outer surface of the tubular member 75, was 0.020 inch. The assembly was attached to a coater and installed in a float glass bath over a glass ribbon, and a flow of nitrogen gas was directed to the tip assembly through a Matheson 605 rotameter to provide accurate flow measurements. Response curves for flow rates of 15 and 13 standard liters per minute, corresponding to Reynolds numbers of 510 and 440, respectively, were generated as illustrated in FIG. 9. Both response curves indicate a pressure inflection in the distance window between 0.100 inch and 0.200 inch. The inflections are undesirable in that they interfere with the determination of sensor-to-glass distance inasmuch as there may be two or more distances within the inflection range which correspond to a given pressure. Such an arrangement would be unreliable for determining true coater-to-glass distance.

EXAMPLE II

Figure 10:
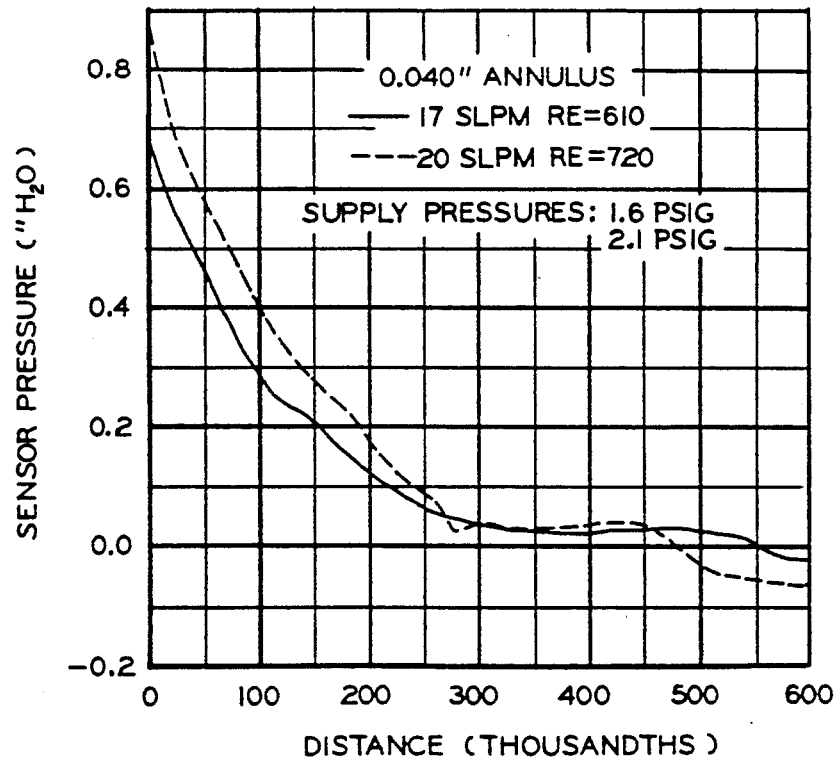
FIG. 10 is a graph similar to FIG. 9 for an annulus having a width of 0.040 inch.

A second tip assembly 74, similar in construction to the first tip assembly except that the annular space or gap 77 had a width of 0.040 inch, was attached to a coater and installed in the float glass bath. Nitrogen gas flows of 17 and 20 standard liters per minute, corresponding to Reynolds numbers of 610 and 720, respectively, were supplied to the tip assembly and response pressures were measured through the tube 94 for various sensor-to-glass distances. Pressure-versus-distance response curves were generated as illustrated in FIG. 10. In contrast to the tip assembly or sensor of Example I, inflections occur at a sensor-to-glass distance of about 0.250 inch to 0.400 inch. The curve varies smoothly and is well-defined in the sensor-to-glass distance window of 0.075 inch to 0.200 inch, which it is desired to measure. At a flow of 17 standard liters per minute, the inflection is minimal so that reliable distance measurements are provided in the range from zero up to about 0.300 inch.

The response curves generated in accordance with the invention, particularly the embodiment of Example II as illustrated in FIG. 10, are very useful in quickly setting the coater 36 at the start of a coating run, as well as in monitoring the coater distance from the ribbon during coating operations. Thus, as the coater is lowered into operating position the sensors will indicate when the coater's lower face approaches within about 0.500 inch of the ribbon surface, and will then accurately indicate coater spacing at any distance below about 0.300 inch, the distance within which the coating coater is normally operated.

It is to be understood that the forms of the invention herewith shown and described are to be taken as illustrative embodiments only if the same, and that various changes in the shape, size and arrangement of parts, as well as various procedural changes, may be resorted to without departing from the spirit of the invention.

What is claimed is:

1. Apparatus for determining the distance between the surface of a ribbon of glass and a coater assembly disposed in spaced relationship thereto for directing coating materials against the surface of the ribbon, comprising a coater assembly, at least one sensing unit attached to said coater assembly, said at least one sensing unit including a head block, an elongated cylindrical outer housing affixed to said head block and having an end facing said glass surface in spaced relationship thereto, a tubular central member affixed to said head block and disposed axially within said cylindrical outer housing, said tubular member having an end remote from said head block coplanar with said end of said outer housing, a bore extending axially within said central member, a plurality of radially extending tabs on the outer surface of said tubular member for positioning said tubular member in spaced axial alignment within said outer housing so as to define an elongated annular space between the outer housing and the central member, an enclosed annular chamber surrounding said cylindrical housing within said head block, a passageway in said head block communicating with said annular chamber, first conduit means connected to said passageway providing a controlled supply of pressurized gas to said annular chamber, a pair of diametrically opposed openings extending through said cylindrical housing providing communication between said annular chamber and said elongated annular space, said opposed openings being offset 90° from said passageway, a second bore extending through said head block in communication with said bore in said central member, back pressure measuring means, and second conduit means operably connecting said second bore and said back pressure measuring means, whereby said pressurized gas supplied through said first conduit means is distributed around said annular chamber and admitted to said annular space through said opposed openings to flow along said elongated annular space for discharge in a laminar annular pattern against said surface, said laminar annular pattern creating a back pressure within said bore which is indicative of the distance between the ribbon surface and the end of the at least one sensing unit and thus of the coater assembly from the ribbon surface.

2. Apparatus for determining the distance between the surface of a ribbon of glass and a coater assembly as claimed in claim 1, including a bracket affixed to said coater assembly, and means adjustably mounting said at least one sensing unit on said bracket for movement to selected vertical positions relative to said coater assembly.

3. Apparatus for determining the distance between the surface of a ribbon of glass and a coater assembly as claimed in claim 1, wherein said annular space has an outer diameter of less than about 0.400 inch.

4. Apparatus for determining the distance between the surface of a ribbon of glass and a coater assembly as claimed in claim 3, wherein said annular space has a width of about 0.040 inch.

5. Apparatus for determining the distance between the surface of a ribbon of glass and a coater assembly as claimed in claim 1, wherein said annular space has a width between about 0.020 inch and 0.040 inch.

* * * * *